(12) United States Patent
Kim

(10) Patent No.: US 11,515,321 B2
(45) Date of Patent: Nov. 29, 2022

(54) MEMORY CELLS, MEMORY ARRAYS, AND METHODS OF FORMING MEMORY ARRAYS

(71) Applicant: Micron Technology, Inc., Boise, ID (US)

(72) Inventor: Changhan Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 17/113,934

(22) Filed: Dec. 7, 2020

(65) Prior Publication Data
US 2021/0118892 A1    Apr. 22, 2021

Related U.S. Application Data

(62) Division of application No. 15/855,089, filed on Dec. 27, 2017, now Pat. No. 10,903,221.

(51) Int. Cl.
*H01L 27/1157* (2017.01)
*H01L 27/11582* (2017.01)
(Continued)

(52) U.S. Cl.
CPC .... *H01L 27/1157* (2013.01); *H01L 27/11524* (2013.01); *H01L 27/11565* (2013.01); *H01L 27/11578* (2013.01); *H01L 27/11582* (2013.01); *H01L 29/40117* (2019.08); *H01L 29/513* (2013.01); *H01L 29/66833* (2013.01); *H01L 29/792* (2013.01)

(58) Field of Classification Search
CPC .......... H01L 27/1157; H01L 27/11578; H01L 27/11582; H01L 27/11524; H01L 27/11551
See application file for complete search history.

(56) References Cited

U.S. PATENT DOCUMENTS 7,427,443 B2    9/2008    Uchimaru et al.
8,455,940 B2    6/2013    Lee et al.
(Continued)

FOREIGN PATENT DOCUMENTS

JP    2005-85962    3/2005
JP    2017-103328   6/2017
(Continued)

OTHER PUBLICATIONS

WO PCT/US2018/063590 IPRP, dated Jun. 30, 2020, Micron Technology, Inc.
(Continued)

*Primary Examiner* — Phat X Cao
(74) *Attorney, Agent, or Firm* — Wells St. John P.S.

(57) ABSTRACT

Some embodiments include a memory cell having a conductive gate, and having a charge-blocking region adjacent the conductive gate. The charge-blocking region includes silicon oxynitride and silicon dioxide. A charge-storage region is adjacent the charge-blocking region. Tunneling material is adjacent the charge-storage region. Channel material is adjacent the tunneling material. The tunneling material is between the channel material and the charge-storage region. Some embodiments include memory arrays. Some embodiments include methods of forming assemblies (e.g., memory arrays).

17 Claims, 18 Drawing Sheets

(51) Int. Cl.
  *H01L 27/11578* (2017.01)
  *H01L 27/11524* (2017.01)
  *H01L 29/792* (2006.01)
  *H01L 27/11565* (2017.01)
  *H01L 29/66* (2006.01)
  *H01L 29/51* (2006.01)
  *H01L 21/28* (2006.01)

(56) References Cited

U.S. PATENT DOCUMENTS

| | | | |
|---|---|---|---|
| 8,643,084 B2 | 2/2014 | Shin et al. | |
| 9,093,547 B2* | 7/2015 | Lee | H01L 27/11582 |
| 9,136,130 B1 | 9/2015 | Wada et al. | |
| 9,653,475 B1 | 5/2017 | Yoshimizu | |
| 9,728,552 B1 | 8/2017 | Fukumoto | |
| 9,905,568 B2 | 2/2018 | Son et al. | |
| 10,083,981 B2 | 9/2018 | Daycock | |
| 10,128,265 B2 | 11/2018 | Carlson | |
| 10,164,009 B1 | 12/2018 | Carlson | |
| 10,700,087 B2 | 6/2020 | Han et al. | |
| 2006/0151821 A1 | 7/2006 | Melik-Martirosian | |
| 2009/0283819 A1 | 11/2009 | Ishikawa et al. | |
| 2009/0321813 A1 | 12/2009 | Kidoh et al. | |
| 2010/0163968 A1* | 7/2010 | Kim | H01L 27/11582 257/E21.423 |
| 2010/0314678 A1 | 12/2010 | Lim et al. | |
| 2011/0233645 A1 | 9/2011 | Iinuma | |
| 2011/0298037 A1 | 12/2011 | Choe et al. | |
| 2012/0012920 A1 | 1/2012 | Shin et al. | |
| 2014/0220750 A1 | 8/2014 | Sohn et al. | |
| 2015/0041879 A1* | 2/2015 | Jayanti | H01L 29/16 438/269 |
| 2015/0132915 A1 | 5/2015 | Park | |
| 2015/0380431 A1 | 12/2015 | Kanamori | |
| 2016/0043093 A1 | 2/2016 | Lee et al. | |
| 2016/0064532 A1 | 3/2016 | Makala | |
| 2016/0071871 A1 | 3/2016 | Kamigaichi | |
| 2016/0118398 A1* | 4/2016 | Yon | H01L 29/7926 438/269 |
| 2016/0163725 A1 | 6/2016 | Kamiya et al. | |
| 2016/0172370 A1 | 6/2016 | Makala et al. | |
| 2017/0084626 A1 | 3/2017 | Kim et al. | |
| 2017/0162593 A1 | 6/2017 | Shimura | |
| 2017/0229474 A1 | 8/2017 | Shimizu | |
| 2017/0243879 A1* | 8/2017 | Yu | H01L 21/31111 |
| 2017/0263613 A1 | 9/2017 | Murakoshi et al. | |
| 2017/0271527 A1 | 9/2017 | Higuchi et al. | |
| 2018/0277554 A1 | 9/2018 | Kaneko | |

FOREIGN PATENT DOCUMENTS

| | | |
|---|---|---|
| JP | 2017-163044 | 9/2017 |
| JP | 2007-9048 | 1/2018 |
| KR | 10-2011-0128717 | 11/2011 |
| KR | 10-2011-0132817 | 12/2011 |
| KR | 10-2012-0007838 | 1/2012 |
| KR | 10-2017-0029795 | 3/2017 |
| KR | 10-2017-0035412 | 3/2017 |
| WO | WO 2016/025192 | 2/2016 |

OTHER PUBLICATIONS

WO PCT/US2018/063590 Search Rept., dated Mar. 29, 2019, Micron Technology, Inc.
WO PCT/US2018/063590 Writ. Opin., dated Mar. 29, 2019, Micron Technology, Inc.
WO PCT/US2018/063978 IPRP, dated Jun. 30, 2020, Micron Technology, Inc.
WO PCT/US2018/063978 Search Rept., dated Apr. 1, 2019, Micron Technology, Inc.
WO PCT/US2018/063978 Writ. Opin., dated Apr. 1, 2019, Micron Technology, Inc.
WO PCT/US2018/064401 IPRP, dated Jun. 30, 2020, Micron Technology, Inc.
WO PCT/US2018/064401 Search Rept., dated Apr. 8, 2019, Micron Technology, Inc.
WO PCT/US2018/064401 Writ. Opin., dated Apr. 8, 2019, Micron Technology, Inc.
EP 18897499 Supp. SR, dated Dec. 23, 2020, Micron Technology, Inc.

* cited by examiner

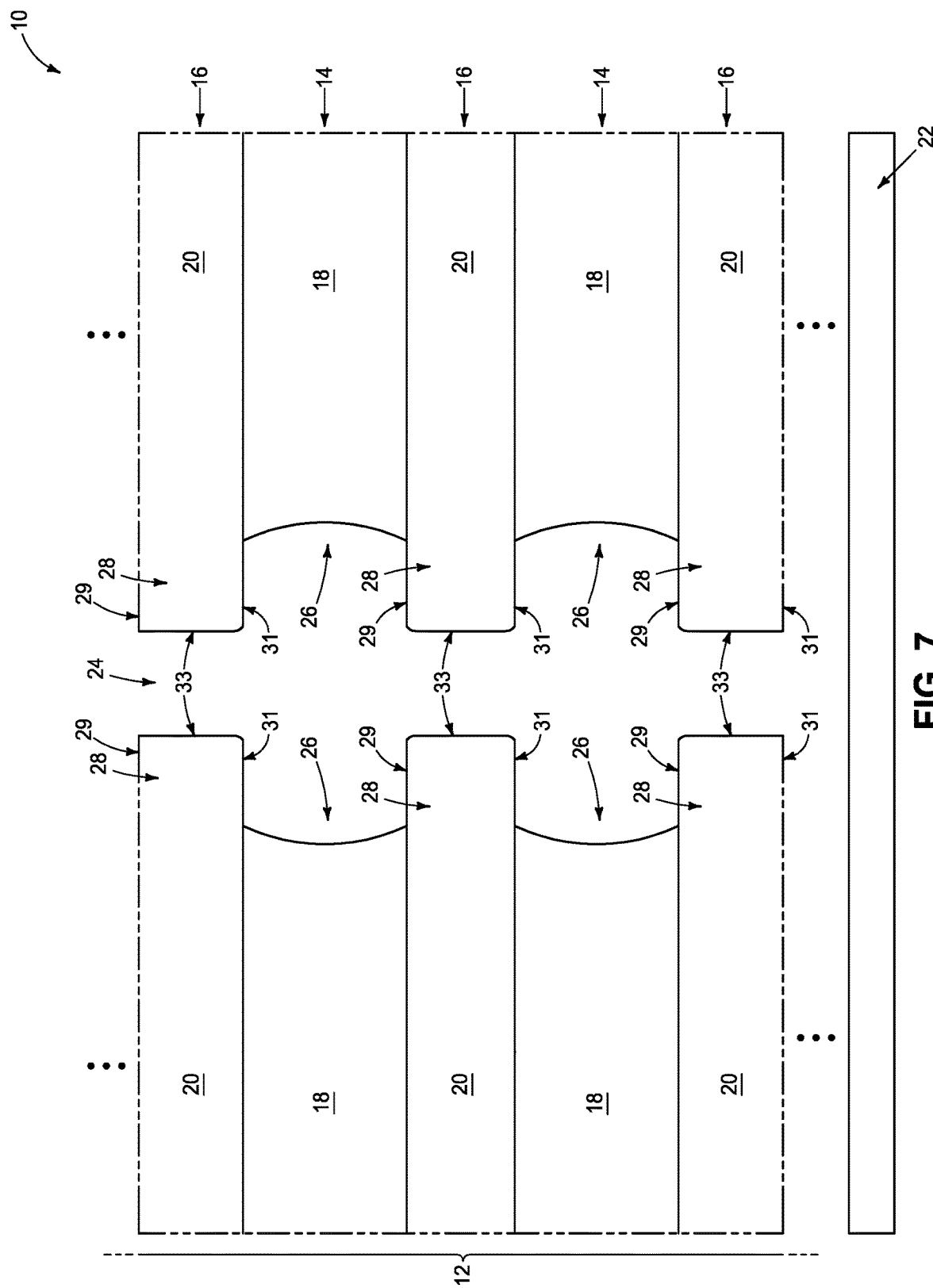

MEMORY CELLS, MEMORY ARRAYS, AND METHODS OF FORMING MEMORY ARRAYS

RELATED PATENT DATA

This patent resulted from a divisional of U.S. patent application Ser. No. 15/855,089 filed Dec. 27, 2017, which is hereby incorporated herein by reference.

TECHNICAL FIELD

Memory cells (e.g., NAND memory cells), memory arrays (e.g., NAND memory arrays), and methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 is used to control memory operations which are to be performed on the memory cells 103, and utilizes signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved memory cell designs, improved memory array architecture (e.g., improved NAND architecture), and methods for fabricating the improved memory cells and improved memory array architectures.

BRIEF DESCRIPTION OF THE DRAWINGS

FIGS. 5-16 are diagrammatic cross-sectional views of regions of a construction at example process steps of an example method for fabricating an example assembly.

DETAILED DESCRIPTION OF THE ILLUSTRATED EMBODIMENTS

Some embodiments include memory cells having charge-blocking regions which comprise silicon oxynitride. The charge-blocking regions may additionally comprise silicon dioxide. Some embodiments include memory arrays (e.g., NAND memory arrays) having vertically-stacked memory cells. The memory cells may include the charge-blocking regions comprising silicon oxynitride. The memory cells they also include charge-storage regions, with vertically-stacked charge-storage regions being spaced from one another by intervening regions of insulative material. Some embodiments include methods of forming memory cells and memory arrays. An example method is described with reference to FIGS. 5-16, and an example architecture is described with reference to FIG. 16.

Figure 1:
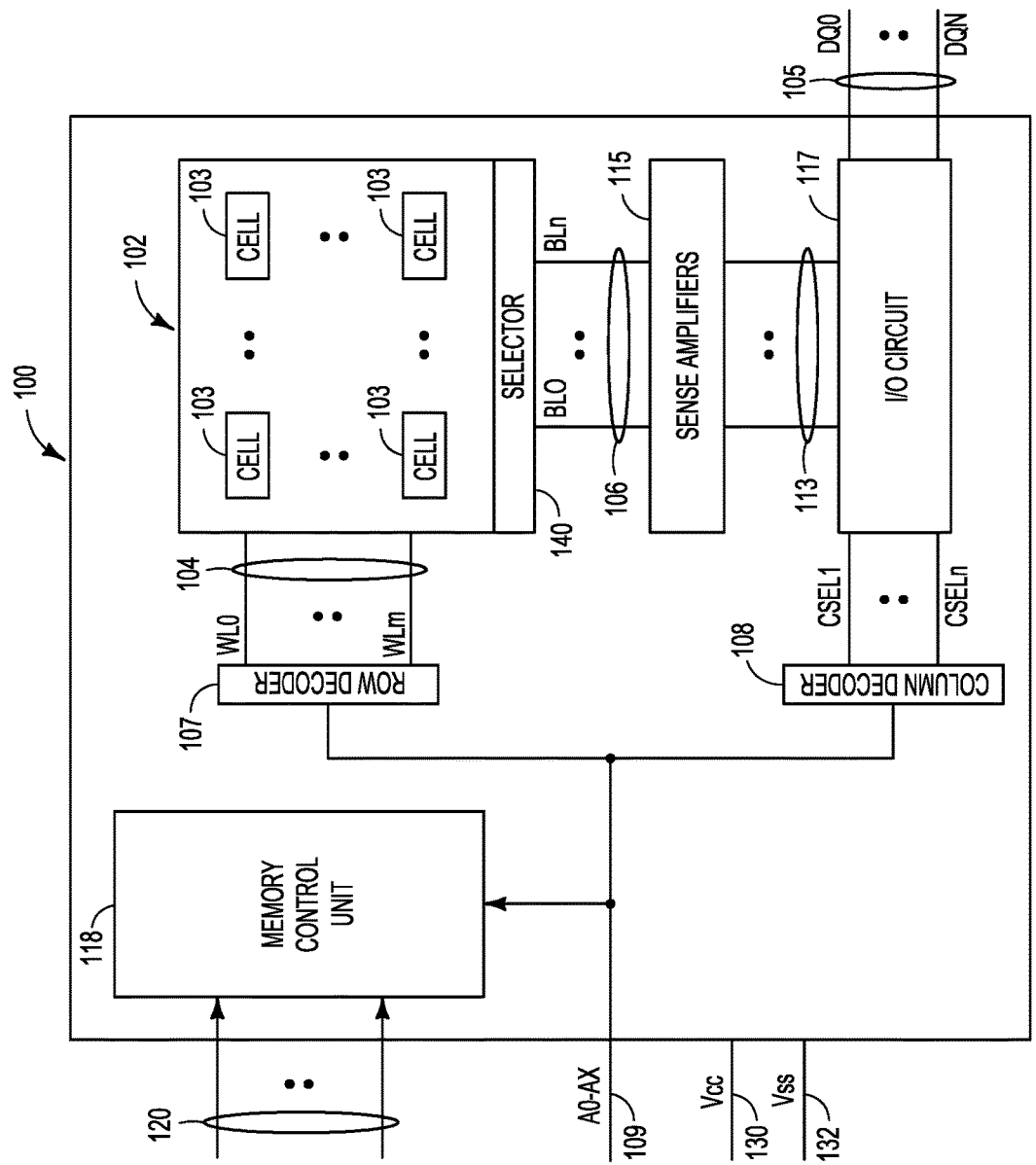
FIG. 1 shows a block diagram of a prior art memory device having a memory array with memory cells.
Figure 2:
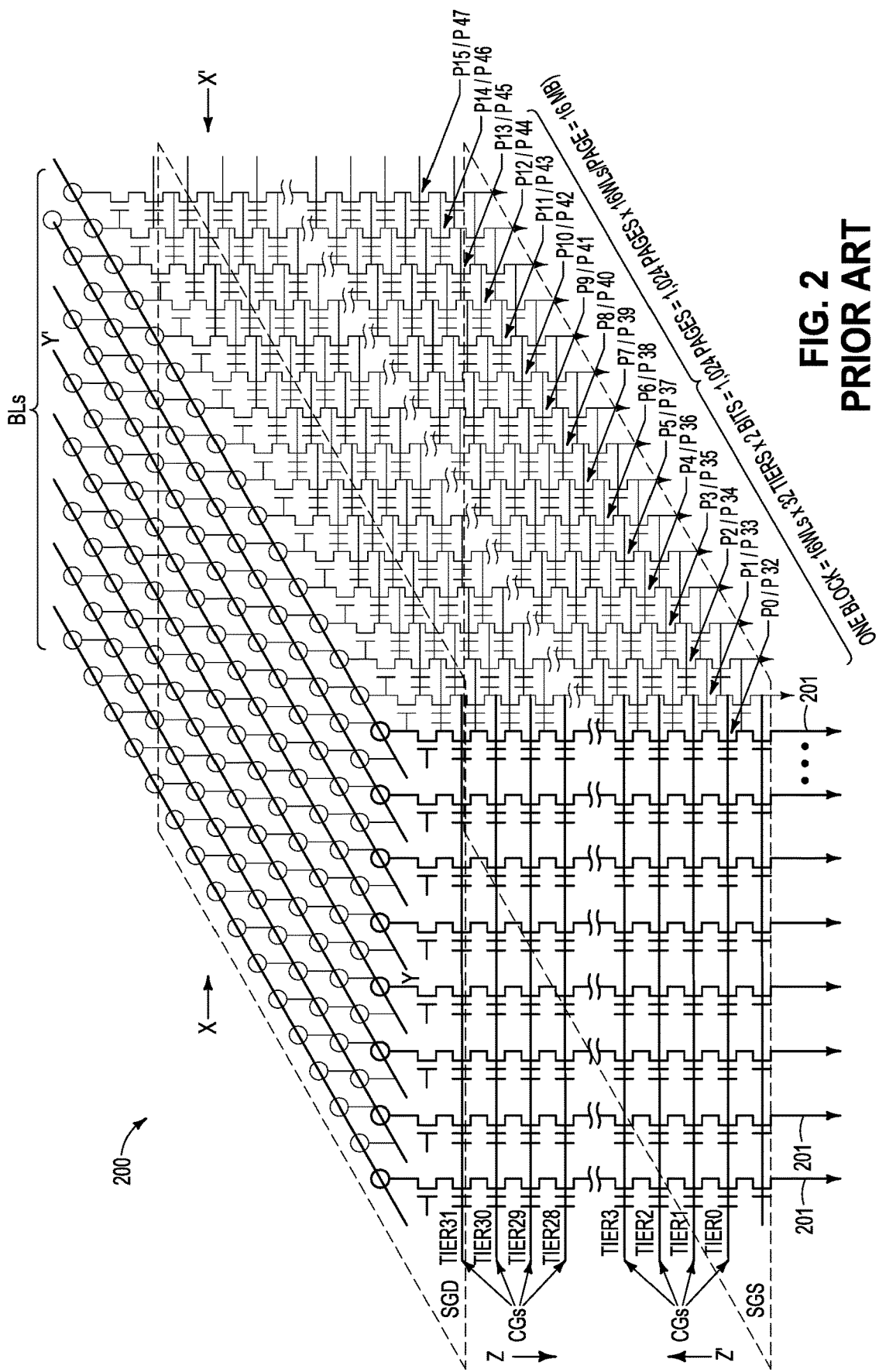
FIG. 2 shows a schematic diagram of the prior art memory array of FIG. 1 in the form of a 3D NAND memory device.
Figure 3:
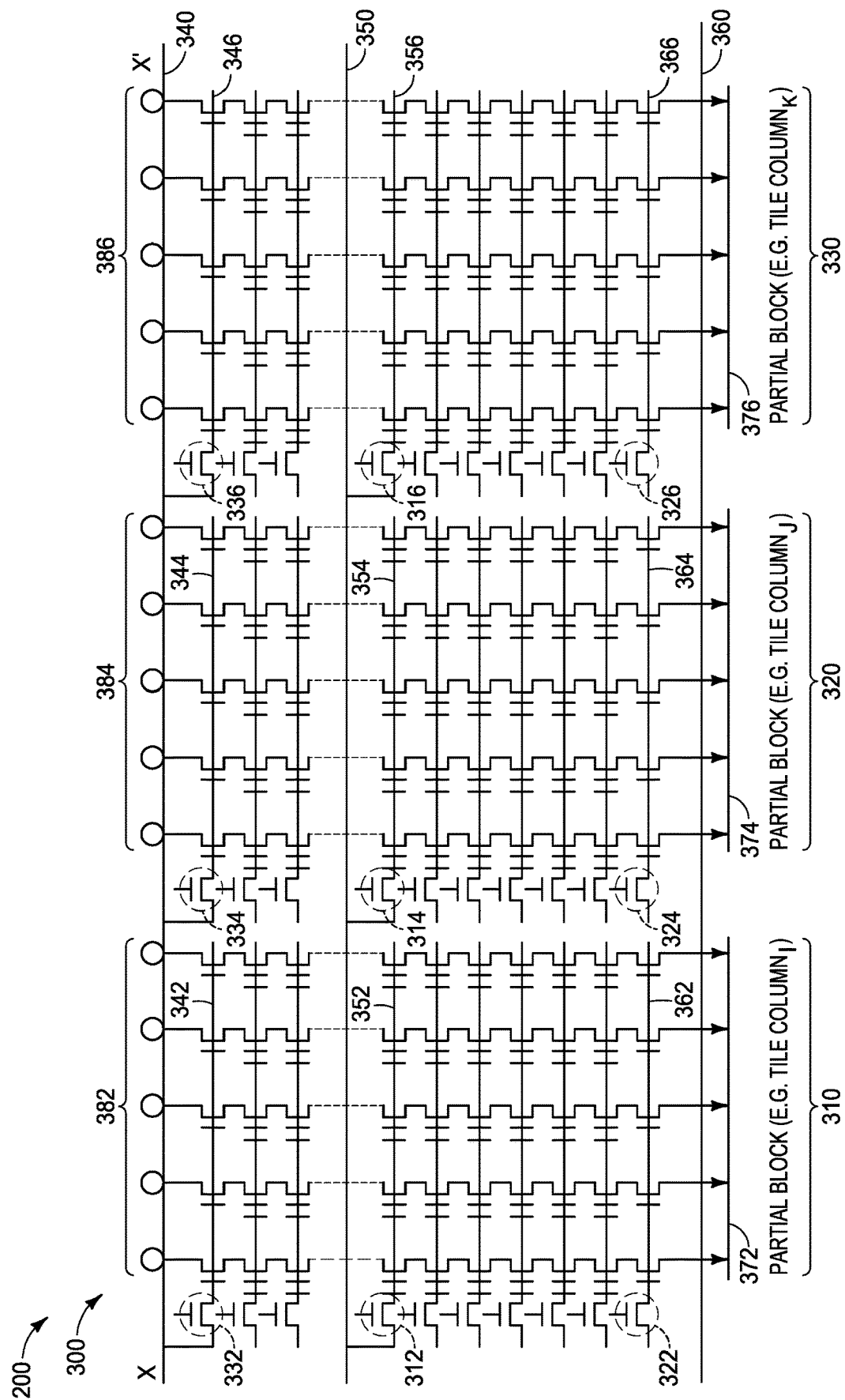
FIG. 3 shows a cross-sectional view of the prior art 3D NAND memory device of FIG. 2 in an X-X' direction.
Figure 4:
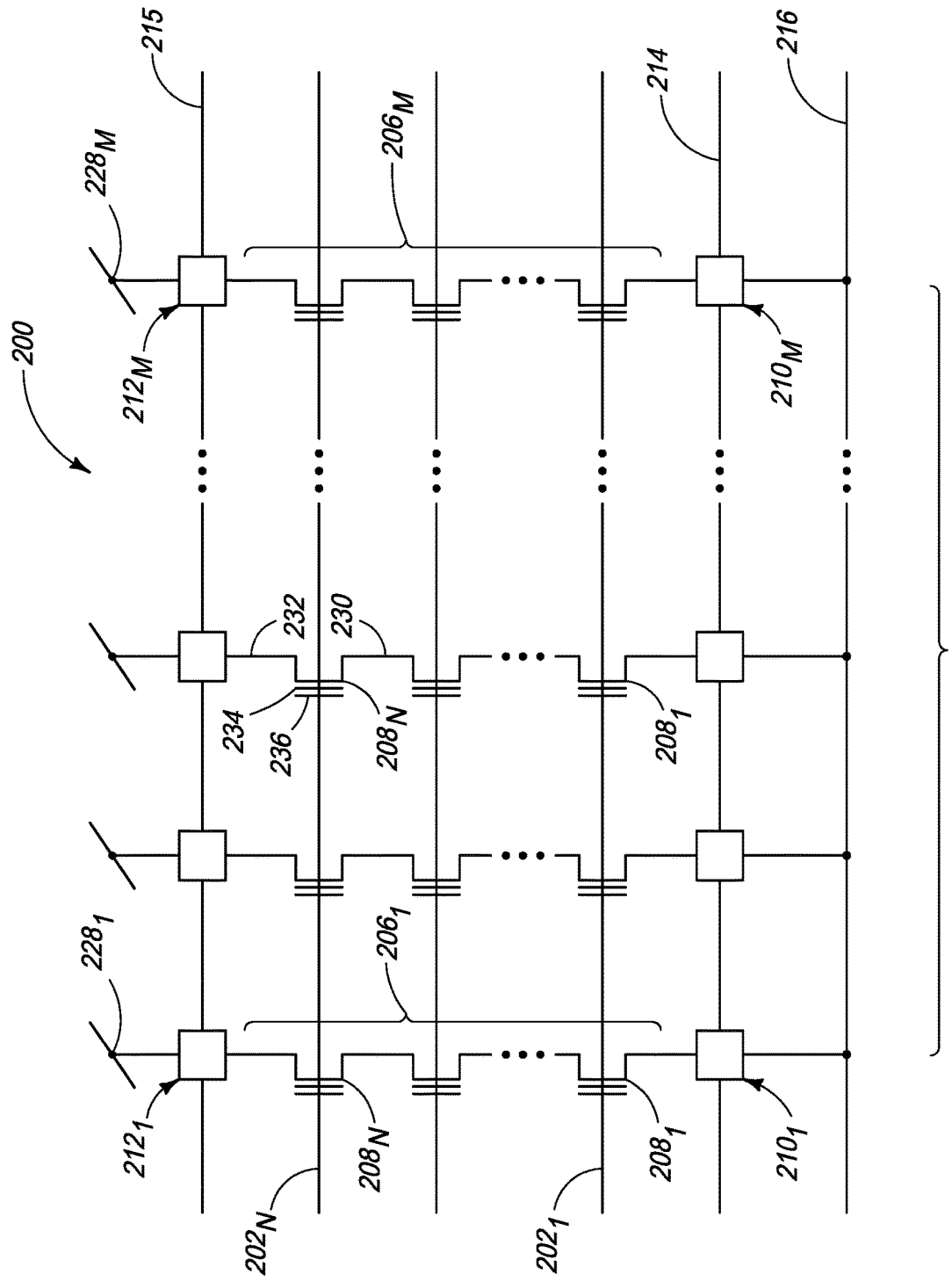
FIG. 4 is a schematic of a prior art NAND memory array.
Figure 5:
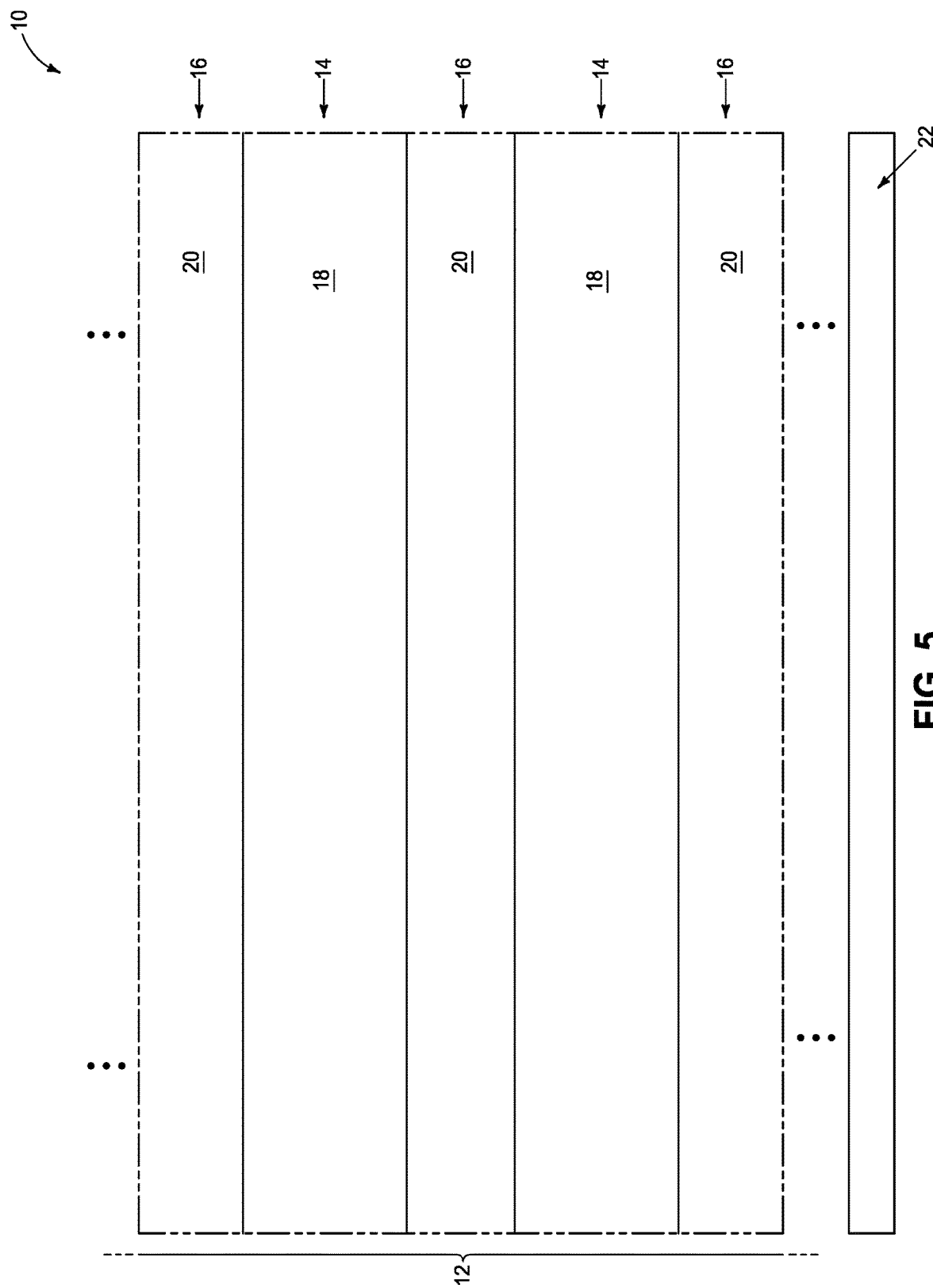

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first material 18 may be sacrificial material (e.g., silicon nitride), and the second material 20 may be insulative material (e.g., silicon dioxide).

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm. In some embodiments, the first levels 14 may be thicker than the second levels 16. For instance, in some embodiments the first levels 14 may have thicknesses within a range of from about 20 nm to about 40 nm, and the second levels 16 may have thicknesses within a range of from about 15 nm to about 30 nm.

Some of the sacrificial material 18 of the first levels 14 is ultimately replaced with conductive material of memory cell gates. Accordingly, the levels 14 may ultimately correspond to memory cell levels of a NAND configuration. The NAND configuration will include strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend outwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
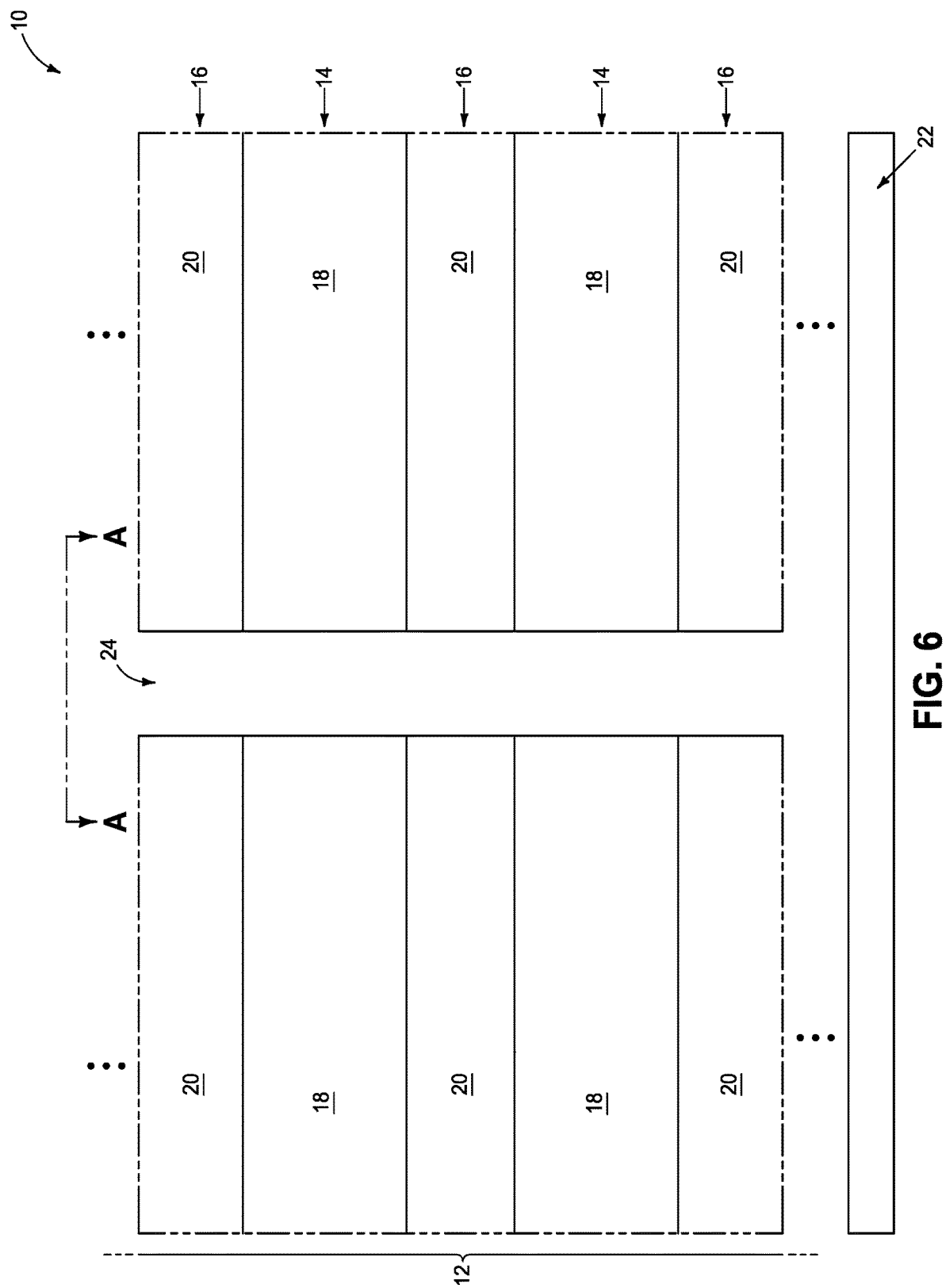
Figure 6A:
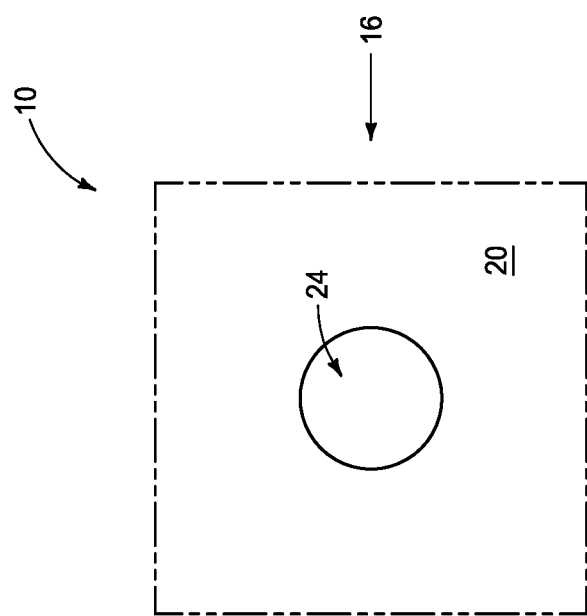
FIGS. 6A and 13A are diagrammatic top views along the lines A-A of FIGS. 6 and 13, respectively.

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 16 of the illustrated region of construction 10, and illustrates an example configuration in which the opening 24 is circular-shaped when viewed from above. In some embodiments, the opening 24 may be referred to as a first opening in order to distinguish it from other openings formed at later process stages.

Referring to FIG. 7, the material 18 of the first levels 14 is recessed along the opening 24 to form gaps (i.e., cavities) 26. In some embodiments, the material 18 of the first levels 14 may comprise, consist essentially of, or consist of silicon nitride; and the material 20 of the second levels 16 may comprise, consist essentially of, or consist of silicon dioxide. In such embodiments, the material 18 may be selectively etched relative to the material 20 utilizing phosphoric acid. The term "selective etching" means that a material is removed faster than another material, and includes, but is not limited to, etching processes which are 100% selective for one material relative to another. In the shown embodiment, front surfaces of material 18 are curved and concave at the processing stage of FIG. 7. In other embodiments, such front surfaces may be convex, straight, or any other suitable shape.

The gaps 26 are vertically between segments 28 of the material 20 of the second levels 16. In some embodiments, the segments 28 of material 20 may be referred to as ledges 28. The ledges 28 are above and below the gaps 26.

The ledges 28 have upper (i.e., top) surfaces 29, lower (i.e., bottom) surfaces 31, and sidewall surfaces 33. The sidewall surfaces 33 are along the opening 24, and extend between the top and bottom surfaces 29 and 31.

Figure 8:
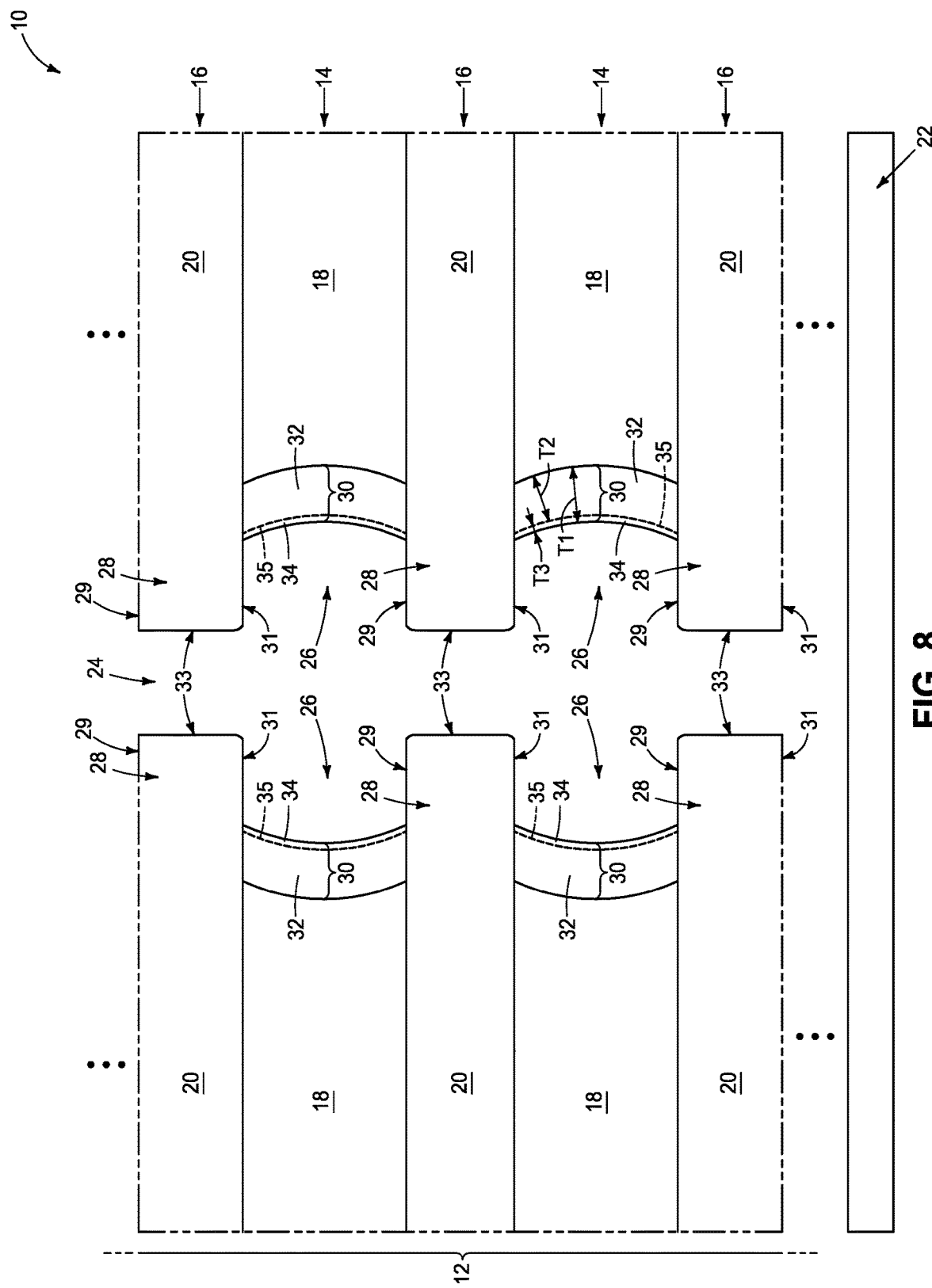

Referring to FIG. 8, edges of the first levels 14 along the gaps 26 are oxidized to form charge-blocking regions 30. In some embodiments, the material 18 comprises, consists essentially of, or consist of silicon nitride. The oxidation of such material 18 may utilize a temperature of at least about 700° C. (but not limited to being at least about 700°, and may be lower if suitable oxidative conditions achieve desired electrical and/or other properties); and may or may not include one or both of plasma and steam. If steam is utilized, the process may comprise in situ steam generation (ISSG). In the illustrated embodiment, the oxidation forms the charge-blocking regions 30 to comprise two different materials 32 and 34, with boundaries between the materials being diagrammatically illustrated with dashed-lines 35. The material 32 may comprise, consist essentially of, or consist of silicon oxynitride; and the material 34 may comprise, consist essentially of, or consist of silicon dioxide. The dashed lines 35 are utilized to indicate that the boundary between the materials 32 and 34 may be an abrupt interface between the silicon oxynitride and the silicon dioxide, or may be a gradient. In some embodiments, at least portions of the charge-blocking regions 30 may be formed by deposition of suitable material(s) (e.g., silicon dioxide), followed by appropriate etching to achieve a desired shape (such as, for example, a shape analogous to the convexly-curved shape of the charge-blocking regions 30 shown in FIG. 8, a concavely-curved shape, a straight shape, etc.).

The charge-blocking regions 30 extend vertically along the gaps 26, and have horizontal thicknesses T1. Such horizontal thicknesses may be of any suitable dimension, and in some embodiments may be within a range of from about 40 angstroms (Å) to about 150 Å. The silicon oxynitride material 32 of the charge-blocking regions has a horizontal thickness T2; and the silicon dioxide material 34 of the charge-blocking regions has a horizontal thickness T3. In some embodiments, the horizontal thickness T2 will be at least about double the horizontal thickness T3. In some embodiments, the horizontal thickness T2 will be within a range of from about 20 angstroms (Å) to about 140 Å; and the horizontal thickness T3 will be within a range of from about 10 Å to about 30 Å. In some embodiments, the horizontal thicknesses T2 and T3 may be referred to as first and second horizontal thicknesses in order to distinguish them from one another.

Figure 9:
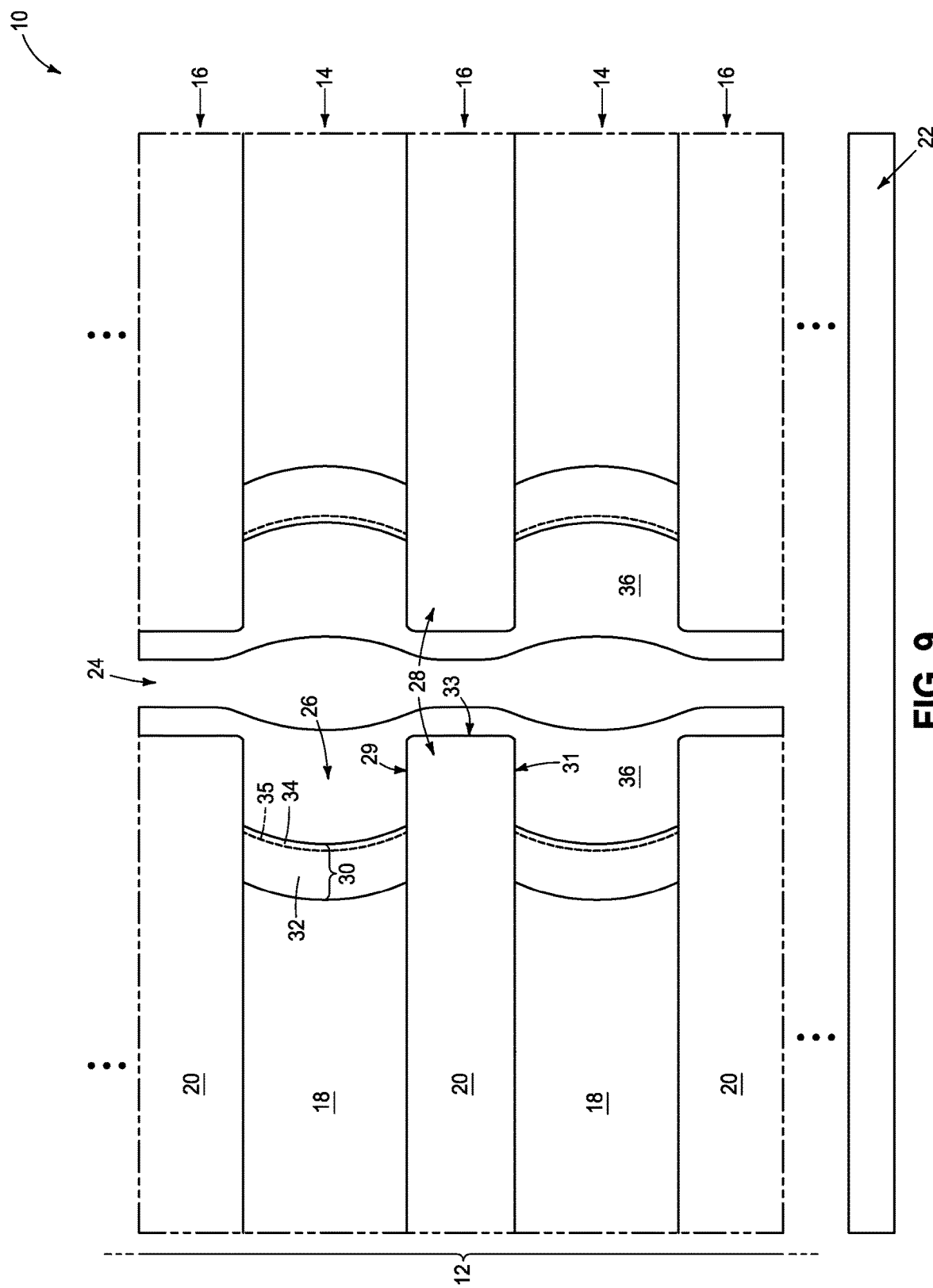

Referring to FIG. 9, charge-storage material 36 is formed within the opening 24 (e.g., deposited within the opening). The charge-storage material may comprise any suitable composition(s); and in some embodiments may comprise charge-trapping materials, such as silicon nitride, silicon oxynitride, conductive nanodots, etc. In alternative embodiments (not shown), the charge-storage material may be configured as floating gate material (such as, for example, polycrystalline silicon). Persons of ordinary skill in the art understand the term "charge-trapping"; and will understand that a "charge trap" may refer to an energy well that can reversibly capture a charge carrier (e.g., an electron or hole).

In some example embodiments, the charge-storage material 36 may comprise, consist essentially of, or consist of silicon nitride.

Figure 10:
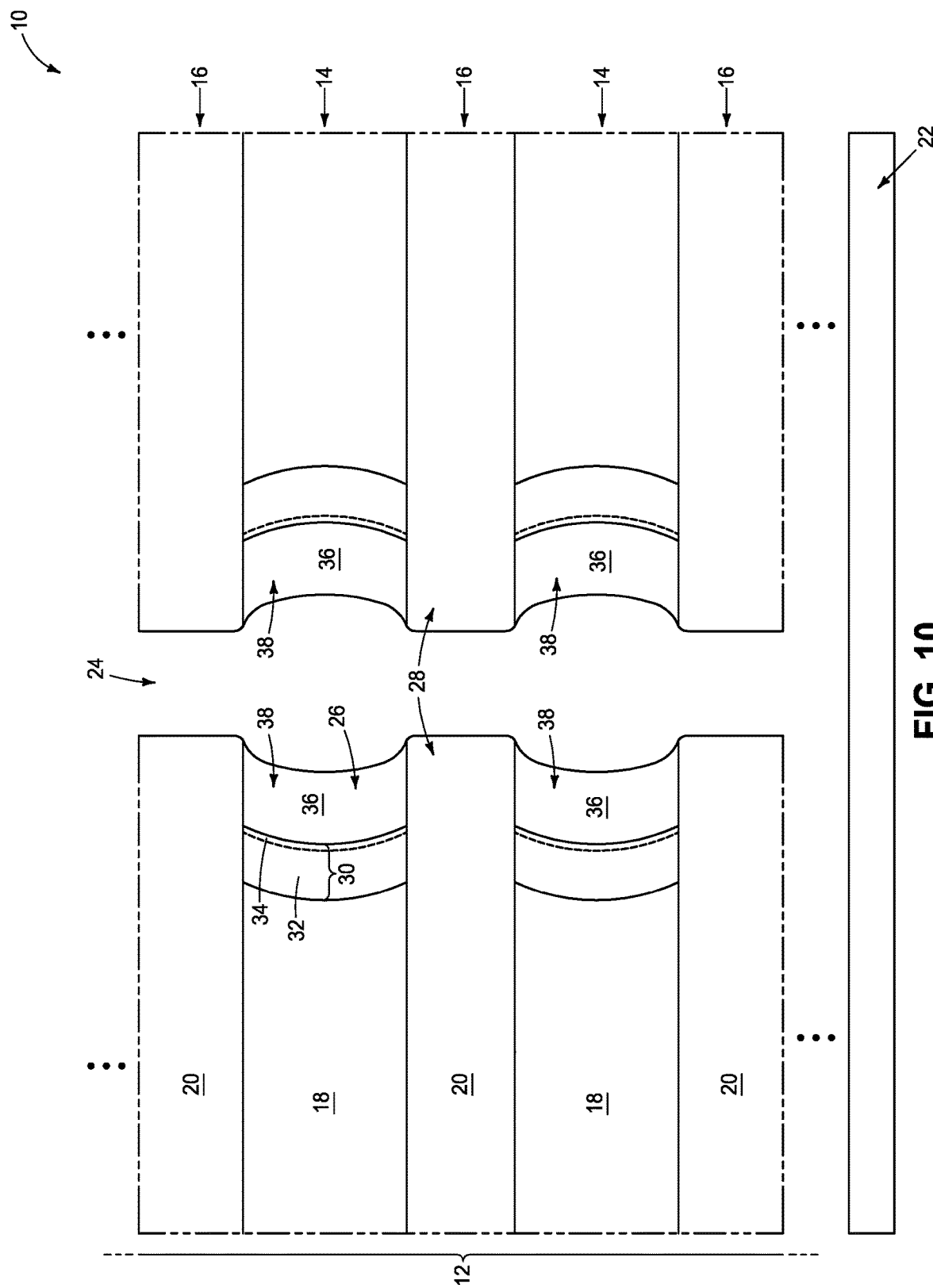

Referring to FIG. 10, the charge-storage material 36 is patterned with a suitable etch to remove the material 36 from the center of opening 24, while leaving the material 36 within the gaps 26. The remaining portions of the material 36 may be considered to be charge-storage regions 38 (e.g., charge-trapping regions). The regions 38 are along the charge-blocking regions 30.

Figure 11:
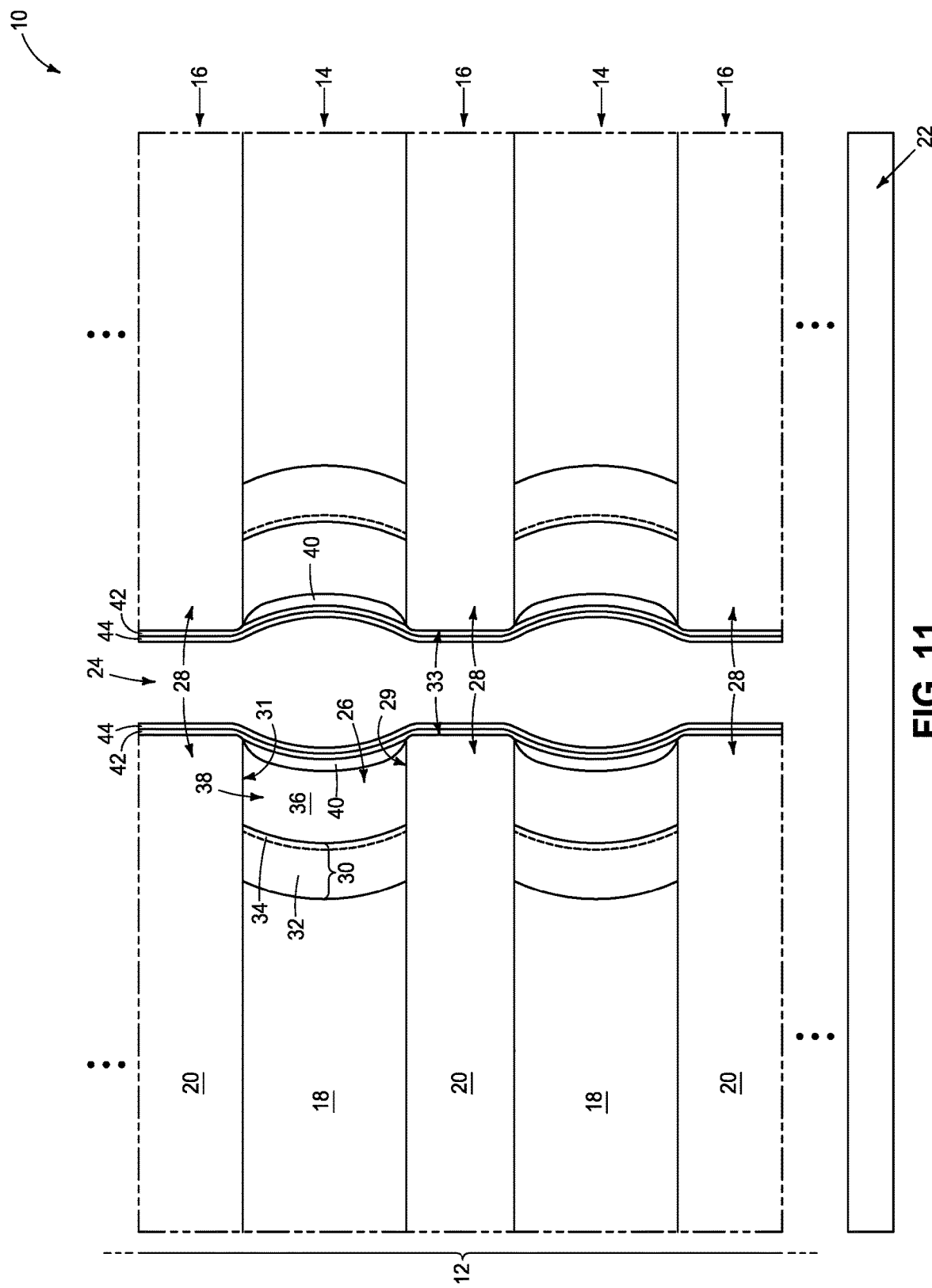

Referring to FIG. 11, tunneling materials 40, 42 and 44 are formed along an outer periphery of the opening 24. The tunneling materials can function as materials through which charge carriers tunnel or otherwise pass during programming operations, erasing operations, etc. In some contexts, one or more of the tunneling materials may be referred to as gate dielectric material, or simply as dielectric material. In the illustrated embodiment, three tunneling materials are utilized. In other embodiments, there may be fewer than three tunneling materials; and in yet other embodiments there may be more than three tunneling materials. In some embodiments, the tunneling materials 40, 42 and 44 may be band-gap engineered to have desired charge tunneling properties. The tunneling material 42 is compositionally different from the materials 40 and 44. The materials 40 and 44 may be compositionally different from one another in some embodiments, and may be compositionally the same as one another in other embodiments.

In some example embodiments, the tunneling material 42 may comprise silicon nitride, and the tunneling materials 40 and 44 may comprise silicon dioxide. In some example embodiments, the tunneling material 40 may comprise one or both of silicon oxynitride and silicon dioxide, the tunneling material 42 may comprise silicon nitride, and the tunneling material 44 may comprise silicon dioxide.

In some embodiments, the tunneling materials 40, 42 and 44 may be referred to as first, second and third tunneling materials, respectively.

The first tunneling material 40 may be formed by oxidizing exposed edges of the charge-storage material 36. Accordingly, the first tunneling material 40 is entirely contained within the gaps (i.e. cavities) 26. In embodiments in which the first tunneling material 40 is entirely contained within the gaps 26, the first tunneling material 40 has upper surfaces directly against the bottom surfaces 31 of the ledges 28, and has lower surfaces directly against the top surfaces 29 of the ledges 28.

The second tunneling material 42 extends vertically along the peripheral edge of the opening 24, and is directly against the sidewall edges 33 of the ledges 28.

Figure 12:
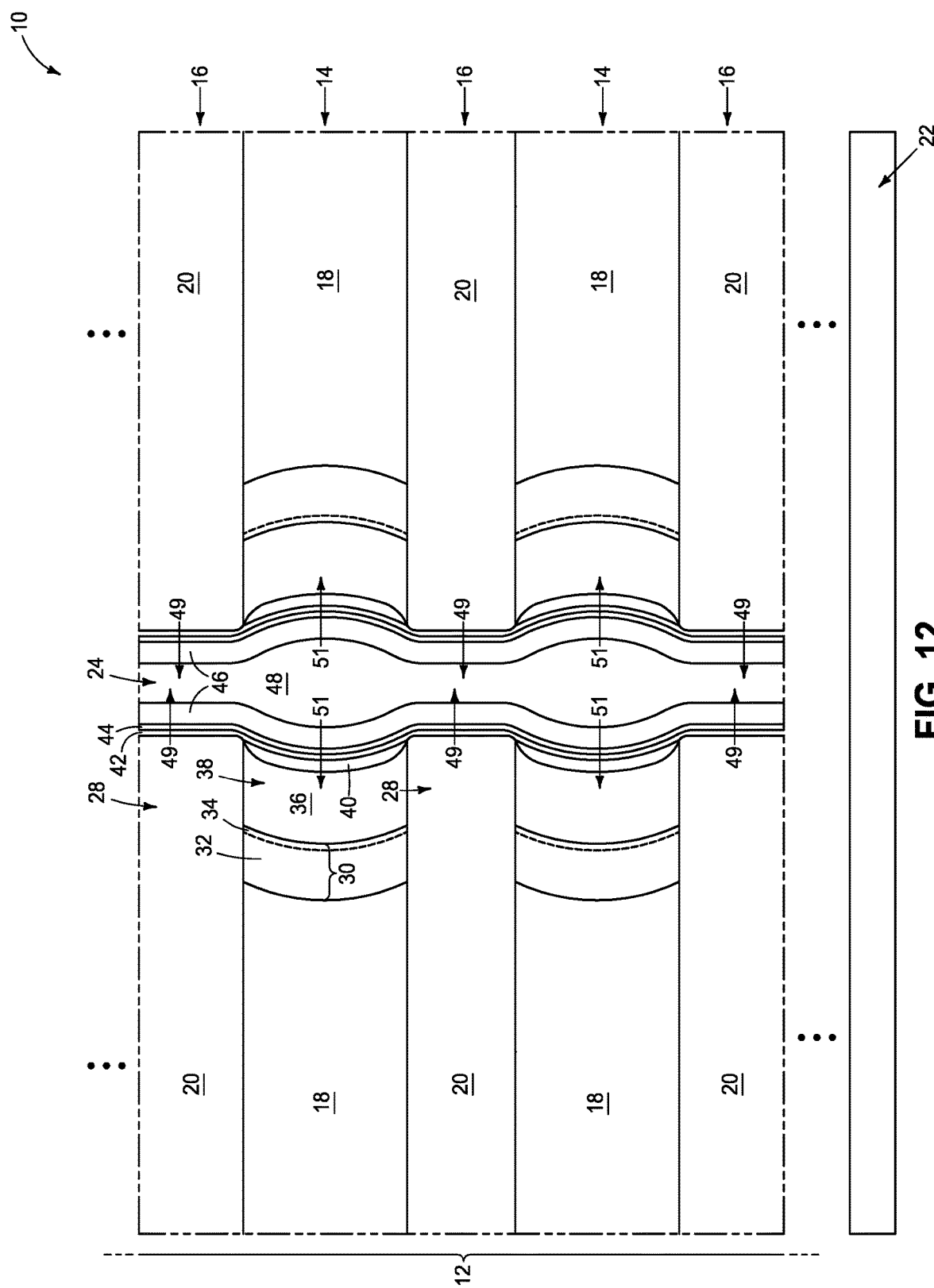

Referring to FIG. 12, channel material 46 is formed within the opening 24 and along the tunneling materials 40, 42 and 44. In the illustrated embodiment, the channel material 46 is directly against the tunneling material 44. The channel material 46 may comprise any suitable appropriately-doped semiconductor material(s); and in some embodiments may comprise one or more of silicon, germanium, III/V semiconductor materials (e.g., gallium phosphide), etc.

In the illustrated embodiment, the channel material 46 lines a periphery of the opening 24, and insulative material 48 fills a remaining interior region of the opening 24. The insulative material 48 may comprise any suitable composition or combination of compositions, such as, for example, silicon dioxide. The illustrated configuration of the channel material 46 may be considered to be a hollow channel configuration, in that the insulative material 48 is provided within a "hollow" in the channel configuration. In other embodiments, the channel material may be configured as a solid pillar.

The channel material 46 extends vertically along the periphery of opening 24; or, in other words, extends vertically through the stack 12. In the illustrated embodiment, the channel material 46 serpentines along a vertical direction. Segments of the channel material 46 along the dielectric material 20 of the insulative second levels 16 project laterally inwardly relative to the opening 24 (as is diagrammatically illustrated with arrows 49), and segments of the channel material 46 along the first levels 14 project outwardly relative to the opening 24 (as is diagrammatically illustrated with arrows 51).

Figure 13:
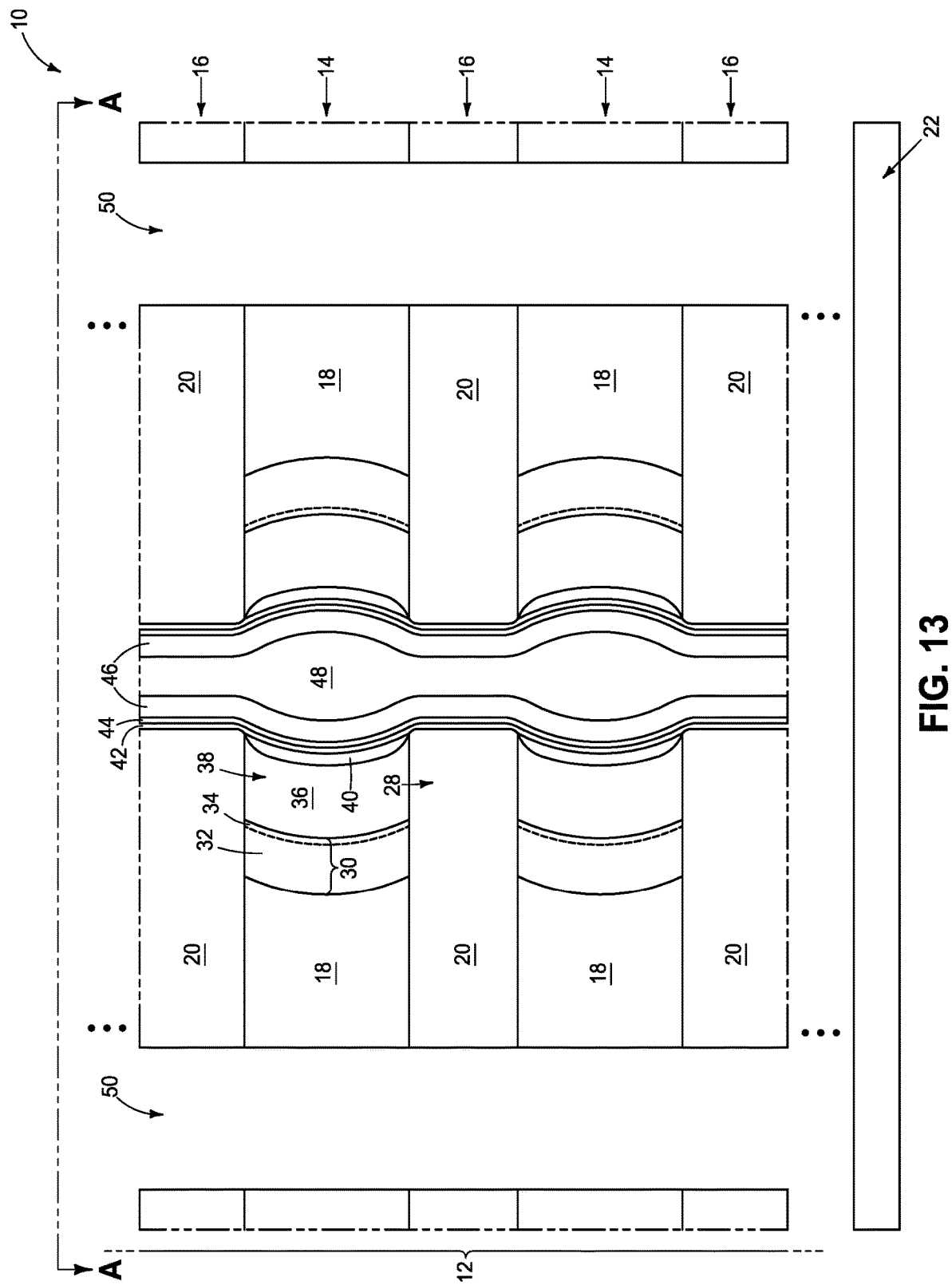

Referring to FIG. 13, second openings 50 are formed through the stack 12. The second openings 50 extend through portions of material 20, and through the portions of material 18 that remain after the oxidation of FIG. 8 is utilized to form the charge-blocking regions 30.

Figure 13A:
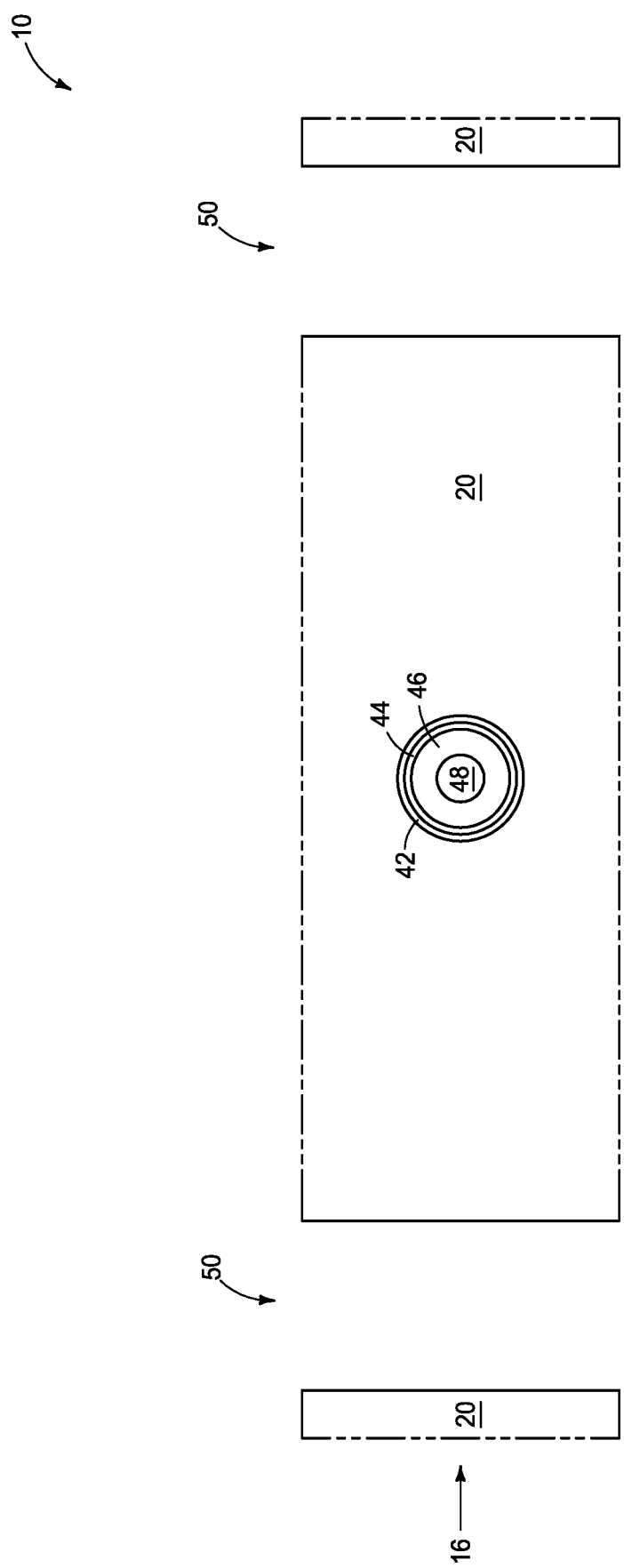

FIG. 13A shows a top view of a portion of the top level 16 of the illustrated region of construction 10, and illustrates an example configuration in which the second openings 50 are configured as slits (i.e., trenches).

Figure 14:
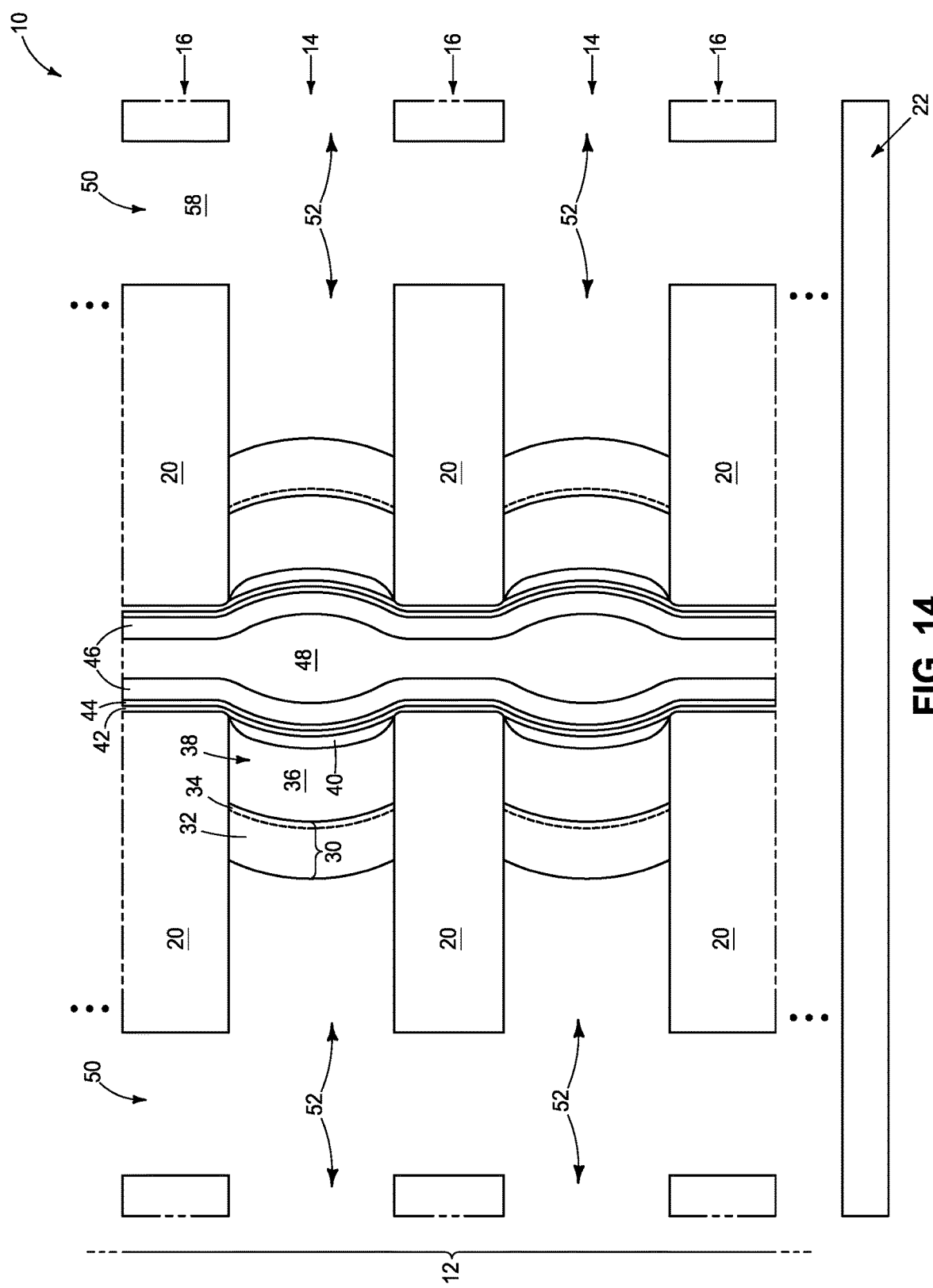

Referring to FIG. 14, the material 18 (FIG. 13) exposed along the sides of openings 50 is removed to leave cavities 52. Such removal may utilize any suitable processing, and in some embodiments may utilize phosphoric acid in a wet etch.

Figure 15:
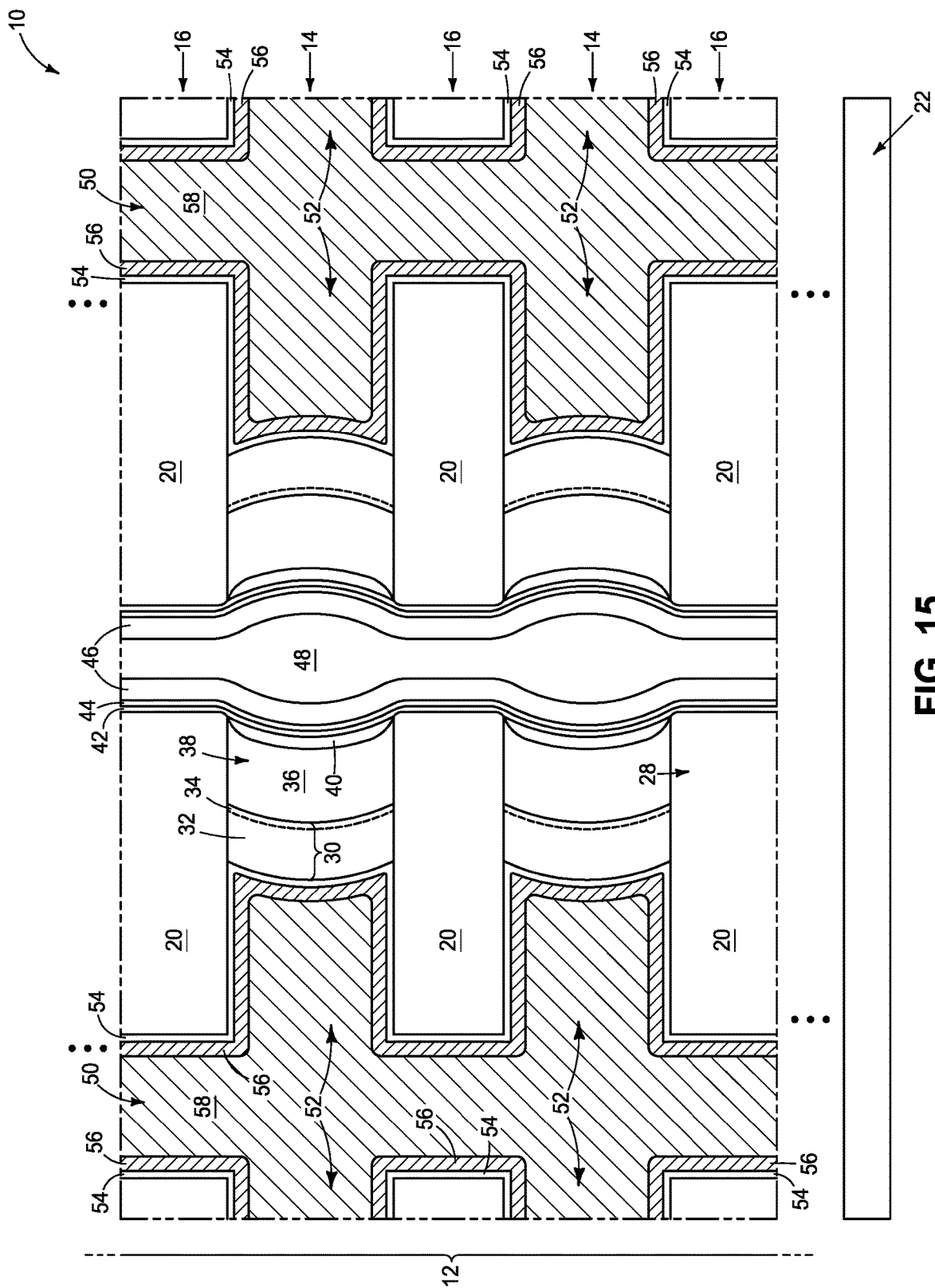

Referring to FIG. 15, dielectric barrier material 54 is deposited within the openings 50. The dielectric barrier material 54 lines peripheral edges of the openings 50, and lines peripheral edges of the cavities 52. The dielectric barrier material 54 may comprise any suitable composition(s); and in some embodiments may comprise one or more high-k materials (with the term high-k meaning a dielectric constant greater than that of silicon dioxide). Example compositions which may be incorporated into the dielectric barrier material are hafnium oxide, zirconium oxide, aluminum oxide, hafnium silicate, zirconium silicate, titanium oxide, gadolinium oxide, niobium oxide, tantalum oxide etc.

Conductive materials 56 and 58 are provided within the lined openings 50 and the lined cavities 52. The conductive materials 56 and 58 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 56 may comprise, consist essentially of, or consist of titanium nitride; and the conductive material 58 may comprise, consist essentially of, or consist of tungsten.

Figure 16:
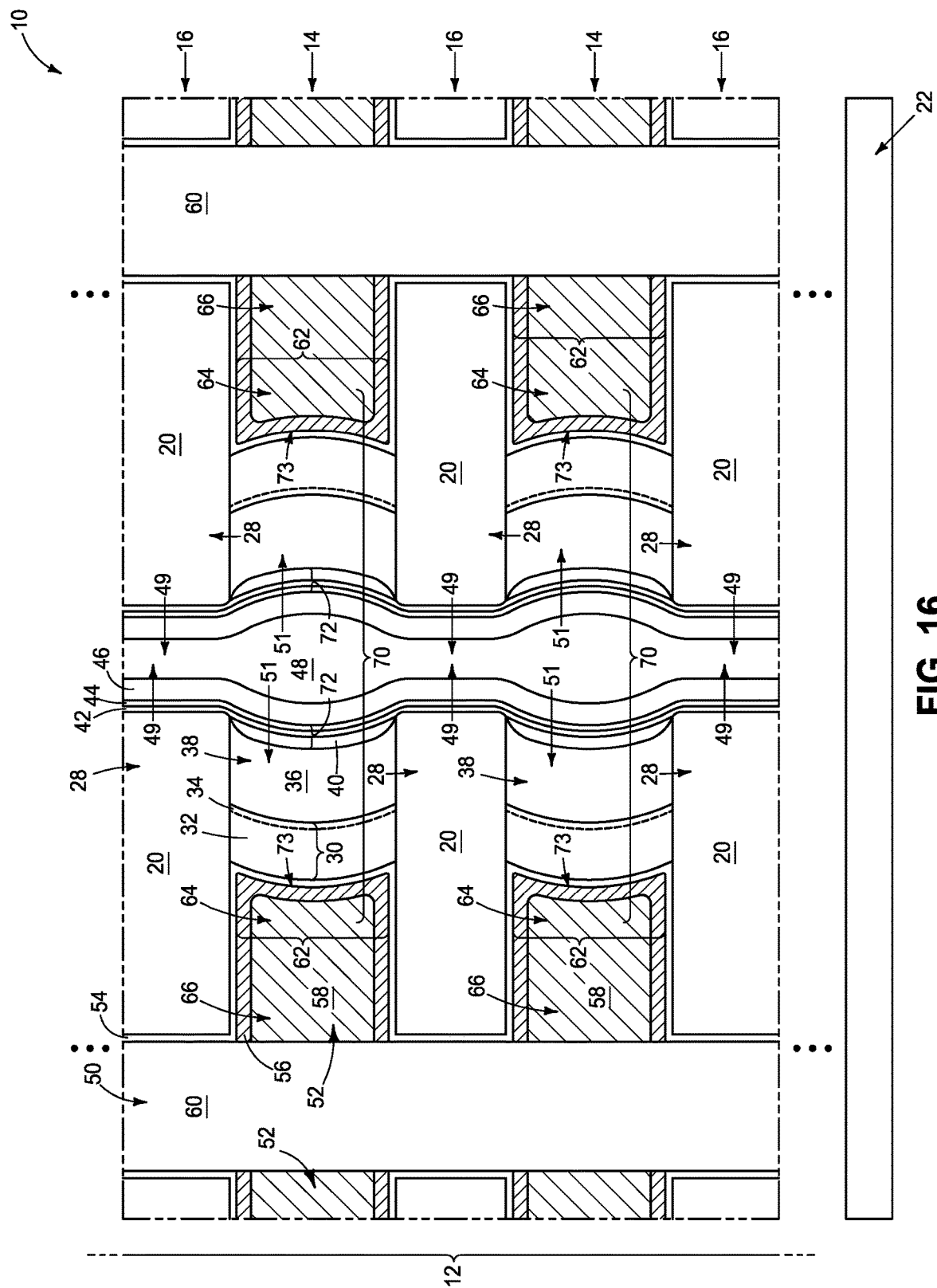

Referring to FIG. 16, conductive materials 56 and 58 are removed from within central regions of openings 50, while leaving the conductive materials 56 and 58 within the cavities 52. Subsequently, insulative material 60 is formed within the central regions of the openings 50. The insulative material 60 may comprise any suitable composition(s); and in some embodiments may comprise, consist essentially of, or consist of silicon oxide.

In the shown embodiment, the dielectric barrier material 54 remains along edges of the openings 50. In other embodiments, the dielectric barrier material 54 may be removed during the etching utilized to remove conductive materials 56 and 58; and may thus only remain within the cavities 52 at a process stage analogous to that of FIG. 16.

The conductive materials 56 and 58 remaining within the cavities 52 together form conductive regions 62. Although the illustrated conductive regions 62 comprise two conductive materials (56 and 58), in other embodiments analogous conductive regions may comprise only a single conductive material, or may comprise more than two conductive materials.

Terminal portions of the conductive regions 62 within the cavities 52 may correspond to conductive gates 64, and other portions of the conductive regions 62 may correspond to wordlines 66. The wordlines are along the levels 14, and accordingly in some embodiments the levels 14 and may be referred to as wordline levels. Such wordline levels may be considered to alternate with the insulative levels 16 within the stack 12 of FIG. 16.

The conductive gates 64, together with the dielectric barrier material 54, charge-blocking regions 30, charge-storage regions 38, tunneling materials 40, 42 and 44, and channel material 46 may be incorporated into memory cells 70. Such memory cells may be NAND memory cells in some embodiments. The illustrated memory cells are vertically-stacked one atop another, and may be part of a NAND string. The memory cells 70 may be considered to be representative of a large number of substantially identical memory cells which may be fabricated across a memory array (with the term "substantially identical" meaning identical to within reasonable tolerances of fabrication and measurement); such as, for example, NAND memory arrays analogous to those described above with reference to FIGS. 1-4.

In operation, the charge-storage regions 38 may be configured to store information in the memory cells 70. The value (with the term "value" representing one bit or multiple bits) of information stored in an individual memory cell 70 may be based on the amount of charge (e.g., the number of electrons) stored in a charge-storage region. The amount of charge within an individual charge-storage region 38 may be controlled (e.g., increased or decreased) at least in part, based on the value of voltage applied to an associated gate 64, and/or based on the value of voltage applied to an associated channel material 46.

The tunneling materials 40, 42 and 44 together form tunneling regions 72 of the memory cells 70. Such tunneling regions may be configured to allow desired tunneling (e.g., transportation) of charge (e.g., electrons) between the charge-storage regions 38 and the channel material 46. The tunneling regions 72 may be configured (i.e., engineered) to achieve a selected criterion, such as, for example, but not limited to, an equivalent oxide thickness (EOT). The EOT quantifies the electrical properties of the tunneling region, (e.g., capacitance) in terms of a representative physical thickness. For example, EOT may be defined as the thickness of a theoretical silicon dioxide layer that would be required to have the same capacitance density as a given dielectric (e.g., tunneling region 72), ignoring leakage current and reliability considerations.

The charge-blocking region 30 is adjacent the charge-storage region 38, and may provide a mechanism to block charge from flowing from the charge-storage region 38 to the gate 64. The dielectric barrier material 54 is provided between the charge-blocking region 30 and the gate 64, and may be utilized to inhibit back-tunneling of electrons from the gate 64 toward the charge-storage region 38. In some embodiments, the dielectric barrier material 54 may be considered to form dielectric barrier regions within the memory cells 70.

In the illustrated embodiment of FIG. 16, the channel material 46 serpentines along a vertical direction in a manner analogous to that discussed above with reference to FIG. 12. Specifically, regions (i.e. segments) of the channel material 46 along the wordline levels 14 extend laterally outwardly toward the conductive gates 64 (as represented by arrows 51), and regions (i.e. segments) of the channel material 46 along the insulative levels 16 extend laterally inwardly (as represented by arrows 49). Also, in the illustrated embodiment the conductive regions 62 have concave vertical faces 73 along the dielectric barrier material 54; and conformal to the outwardly-extending segments of the serpentining channel material 46.

The embodiments described herein may be utilized to form vertically-serpentining channel materials 46, curved tunneling regions 72, curved charge-storage regions 36, curved charge-blocking regions 30, curved dielectric barrier material 54, and curved faces 73 along the gate regions; all of which are shown in FIG. 16. In other embodiments, the channel material may be substantially vertically straight, the tunneling regions 72 may be substantially vertically straight, the charge-storage regions 36 may be substantially vertically straight, the charge-blocking regions 30 may be substantially vertically straight, the dielectric barrier material 54 may be substantially vertically straight, and/or the faces 73 along the gate regions may be substantially vertically straight.

The illustrated memory cells 70 may be considered to be an upper memory cell and a lower memory cell. The charge-storage region (i.e., charge-storage structure) 38 of the upper memory cell may be considered to be vertically-neighboring to the charge-storage region (i.e., charge-storage structure) 38 of the lower memory cell. The vertically-neighboring charge-storage regions 38 are vertically-spaced from one another by an intervening region (i.e. ledge) 28 of an insulative level 16. The vertical separation of the charge-storage regions 38 from one another may alleviate or prevent charge leakage between neighboring charge-storage regions within a common NAND string; and may mitigate coupling of charge-storage regions with other components (e.g., neighboring charge-storage regions, control gate, channel, tunnel oxide, etc.). Such may enable substantial improvements relative to a conventional NAND configuration having a continuous charge-storage structure extending along all of the memory cells of a NAND string. Example improvements may include one or more of improved endurance, improvement in read/write budget, improvement in quick charge gain, improvement in quick charge loss, reduced cell-to-cell capacitive coupling, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell having a conductive gate, and having a charge-blocking region adjacent the conductive gate. The charge-blocking region includes silicon oxynitride and silicon dioxide. A charge-storage region is adjacent the charge-blocking region. Tunneling material is adjacent the charge-storage region. Channel material is adjacent the tunneling material. The tunneling material is between the channel material and the charge-storage region.

Some embodiments include an assembly having a vertical stack of alternating insulative levels and wordline levels. The wordline levels comprise conductive regions. Charge-storage regions are along the conductive regions. Charge-blocking regions are between the charge-storage regions and the conductive regions. The charge-blocking regions comprise silicon dioxide extending vertically along silicon oxynitride. The silicon dioxide is between the silicon oxynitride and the charge-storage regions.

Some embodiments include a memory array having a vertical stack of alternating insulative levels and wordline levels. Channel material extends vertically along the stack. The wordline levels comprise conductive regions. The conductive regions are spaced from the channel material by gaps. The insulative levels comprise ledges above and below at least portions of the gaps. Charge-storage regions are within the gaps. The charge-storage regions are vertically spaced from one another by intervening regions of the ledges. Charge-blocking regions are within the gaps and between the charge-storage regions and the conductive regions. The charge-blocking regions comprise silicon dioxide extending vertically along silicon oxynitride. The silicon dioxide is between the silicon oxynitride and the charge-storage regions.

Some embodiments include a method of forming an assembly. A first opening is formed through a stack of alternating first and second levels. The first levels comprise a first material, and the second levels comprise a second material. The first material of the first levels is recessed along the first opening to form gaps. The gaps are vertically between segments of the second material of the second levels. The segments of the second material of the second levels are ledges above and below the gaps. Edges of the first material of the first levels are oxidized along the gaps to form charge-blocking regions along remaining portions of the first material. Charge-trapping regions are formed within the gaps and along the charge-blocking regions. Vertically-extending tunneling material is formed within the first opening. The tunneling material extends along edges of the second material of the second levels and along the charge-trapping regions. Channel material is formed within the first opening and along the tunneling material. A second opening is formed through the stack, with the second opening extending through the remaining portions of the first material. The remaining portions of the first material are removed to form cavities along the second opening. Conductive regions are formed within the cavities.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an assembly, comprising:
   forming a first opening through a stack of alternating first and second levels; the first levels comprising a first material, and the second levels comprising a second material;
   recessing the first material of the first levels along the first opening to form gaps; the gaps being vertically between segments of the second material of the second levels; the segments of the second material of the second levels being ledges above and below the gaps, remaining portions of the first material within the gaps having concave vertical faces;
   oxidizing edges of the first material of the first levels along the gaps to form charge-blocking regions along the remaining portions of the first material, the charge-blocking regions having concave vertical faces;
   forming charge-trapping regions within the gaps and along the concave vertical faces of the charge-blocking regions, the charge-trapping regions having concave vertical faces;
   forming a vertically-extending tunneling material within the first opening, the tunneling material extending along edges of the second material of the second levels and along the concave vertical faces of the charge-trapping regions;
   forming a channel material within the first opening and adjacent the tunneling material;
   forming a second opening through the stack, with the second opening extending through the remaining portions of the first material;
   removing the remaining portions of the first material to form cavities along the second opening; and
   forming conductive regions within the cavities.

2. The method of claim 1 wherein the oxidizing utilizes in situ steam generation.

3. The method of claim 1 wherein the oxidizing utilizes plasma.

4. The method of claim 1 wherein the first material comprises silicon nitride, and wherein the second material comprises silicon dioxide.

5. The method of claim 1 wherein the first material comprises silicon nitride, and wherein the charge-blocking regions comprise silicon oxynitride.

6. The method of claim 5 wherein the charge-blocking regions also comprise silicon dioxide.

7. The method of claim 6 wherein the silicon oxynitride of the charge-blocking regions has a first horizontal thickness; wherein the silicon dioxide of the charge-blocking regions has a second horizontal thickness; and wherein the first horizontal thickness as at least about double the first horizontal thickness.

8. The method of claim 6 wherein the silicon oxynitride of the charge-blocking regions has a horizontal thickness within a range of from about 20 Å to about 140 Å, and wherein the silicon dioxide of the charge-blocking regions has a horizontal thickness within a range of from about 10 Å to about 30 Å.

9. The method of claim 1 wherein the channel material serpentines along a vertical direction, with segments of the channel material along the second levels projecting laterally inwardly relative to the first opening, and segments of the channel material along the first levels projecting laterally outwardly relative to the first opening.

10. The method of claim 1 wherein the tunneling material is a second tunneling material, and further comprising forming a first tunneling material along edges of the charge-trapping regions; the first tunneling material being only within the gaps; the second tunneling material being between the first tunneling material and the channel material; and the second tunneling material being compositionally different from the first tunneling material.

11. The method of claim 10 further comprising forming a third tunneling material along the second tunneling material; the third tunneling material being between the second tunneling material and the channel material; and the third tunneling material being compositionally different from the second tunneling material.

12. A method of forming a memory cell, comprising:
    forming a conductive gate;
    forming a charge-blocking region adjacent the conductive gate; the charge-blocking region comprising silicon oxynitride and silicon dioxide and having an upper surface and a lower surface, each of the upper and lower surfaces contacting an insulative material;
    forming a charge-storage region adjacent the charge-blocking region;
    forming a tunneling region adjacent the charge-storage region, the tunneling region comprising a first tunneling material and a second tunneling material, the first tunneling material being directly against the charge-storage region and extending elevationally from the upper surface to the lower surface, the second tunneling material being against the first tunneling material and having first regions extending to an elevation above the upper surface and second regions extending elevationally below the lower surface, the first and second regions being in physical contact with vertical surfaces of the insulative material; and
    forming a channel material adjacent the tunneling region, the tunneling region being between the channel material and the charge-storage region; the conductive gate, the charge-blocking region, the charge-storage region and the tunneling region having concave vertical faces.

13. The method of claim 12 wherein the charge-blocking region comprises the silicon oxynitride proximate the conductive gate, and comprises the silicon dioxide spaced from the conductive gate by the silicon oxynitride.

14. The method of claim 13 wherein the silicon oxynitride of the charge-blocking region is directly against a dielectric barrier region, and wherein the dielectric barrier region is directly against conductive material of the conductive gate.

15. The memory cell of claim 12 wherein the silicon dioxide of the charge-blocking region is directly against the charge-storage region.

16. The method of claim 12 wherein the charge-storage region comprises silicon nitride, and wherein the silicon nitride is directly against the silicon dioxide of the charge-blocking region.

17. The method of claim 12 wherein the charge-blocking region has a thickness between the conductive gate and the charge-storage region which is within a range of from about 50 Å to about 150 Å, and wherein the silicon dioxide of the charge-blocking region has a thickness between the conductive gate and the charge-storage region which is within a range of from about 10 Å to about 30 Å.

\* \* \* \* \*